United States Patent [19]

Vonno et al.

[11] Patent Number: 5,081,063
[45] Date of Patent: Jan. 14, 1992

[54] METHOD OF MAKING EDGE-CONNECTED INTEGRATED CIRCUIT STRUCTURE

[75] Inventors: Nicolaas V. Vonno, Melbourne; Patrick A. Begley, West Melbourne, both of Fla.

[73] Assignee: Harris Corporation, Melbourne, Fla.

[21] Appl. No.: 382,388

[22] Filed: Jul. 20, 1989

[51] Int. Cl.⁵ .............................................. H01L 21/44
[52] U.S. Cl. .............................. 437/180; 437/2; 437/4; 437/203; 437/204; 437/226; 437/233
[58] Field of Search ............... 437/180, 203, 204, 226, 437/906, 2, 4, 7, 188, 183

[56] References Cited

U.S. PATENT DOCUMENTS

| | | | |
|---|---|---|---|
| 4,188,709 | 2/1980 | Lorenze, Jr. et al. | 437/180 |
| 4,200,794 | 4/1980 | Newberry et al. | 437/164 |
| 4,290,064 | 4/1990 | Whight | 437/203 |
| 4,326,332 | 4/1982 | Kenney | 437/203 |
| 4,788,158 | 11/1988 | Chatterjee | 437/203 |
| 4,788,161 | 11/1988 | Goto et al. | 437/906 |
| 4,845,052 | 7/1989 | Abend | 437/2 |
| 4,910,154 | 3/1990 | Zanio et al. | 437/3 |

*Primary Examiner*—Brian E. Hearn
*Assistant Examiner*—Trung Dang
*Attorney, Agent, or Firm*—Evenson, Wands, Edwards, Lenahan & McKeown

[57] ABSTRACT

A focal plane array and an associated technique for manufacturing such an array, employ a first, substantially planar semiconductor substrate, that contains a densely compacted array of photodiodes, interconnected with a plurality of second semiconductor substrates in which the signal processing electronics for the array are formed. The backside of the focal plane array-containing substrate has an associated array of conductive bumps to which the respective photodiodes on the imaging side are electrically connected. Within plural ones of second semiconductor substrates, each of which is associated with a respective row of the array of photodiodes there are integrated the signal processing electronics for that row. Formed along side edge portions of the second substrates are a plurality of metallic bumps which are conductively connected to the signal processing electronics. Each signal processing substrate is conductively joined to the photodiode chip by corresponding bumps that have been electroplated along the side edge portion of that second semiconductor substrate to internal conductive regions that terminate at that side edge portion. Each conductive region is preferably comprised of doped semiconductor material which extends to the side edge portion of the substrate and is connected to regions of the signal processing devices within the semiconductor substrate.

14 Claims, 5 Drawing Sheets

METHOD OF MAKING EDGE-CONNECTED INTEGRATED CIRCUIT STRUCTURE

FIELD OF THE INVENTION

The present invention relates in general to the manufacture of semiconductor devices and is particularly directed to a scheme for providing edge-connections on and interconnecting an integrated circuit-containing substrate with an adjacent semiconductor structure.

BACKGROUND OF THE INVENTION

Multi-component electronic signal processing systems typically contain a number of modules that are respectively dedicated to the performance of individual signal processing functions. This is particularly true in opto-electronic devices, such as hybrid infrared imaging systems, in which both high resolution and compact physical size are obtained by integrating a plurality of photoresponsive elements (for example, a two dimensional focal plane array of HgCdTe photodiodes) within their own dedicated semiconductor wafer, and housing the associated signal processing electronics in a separate module. This separate unit containing the signal processing electronics typically takes the form of a large scale integrated circuit chip, from one planar surface of which there extends a plurality of land regions or metallic bumps as the interconnect mechanism to be joined with corresponding signal coupling regions on the rear (non-imaging surface) of the photodiode wafer.

As the optical density of focal plane arrays increases, the ability to house the signal processing components within associated, limited area, regions of an adjacent 'piggy-back' semiconductor wafer becomes increasingly difficult. Namely, as the number of interconnect bumps required to accommodate the smaller sized (and more closely spaced) photodiodes increases, the amount of semiconductor real estate that is available within the 'piggy-back' substrate for the device regions of the signal processing components diminishes, and eventually limits the resolution of the array for a given imaging size.

Figure 1:
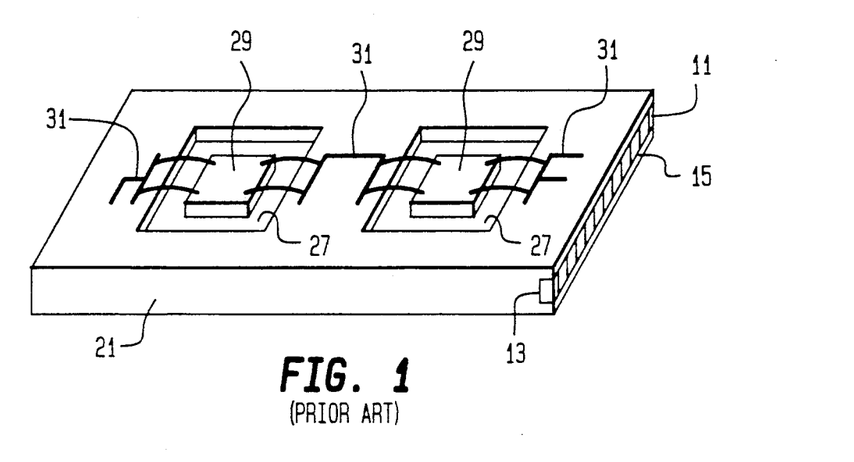
FIG. 1 diagrammatically illustrates a prior art stripe-configured photo/signal processing ceramic printed circuit board.
Figure 2:
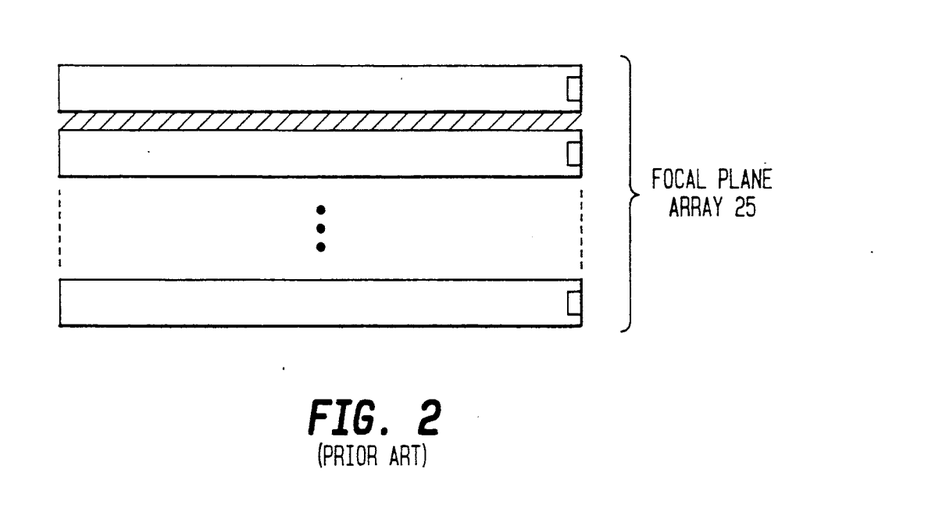
FIG. 2 illustrates a parallel, layered arrangement, of multiple ones of the circuit boards depicted in FIG. 1.

One proposal to obviate this area limitation is diagrammatically depicted in FIG. 1 and involves installing a photodiode die or strip 11 within a slot 13 in one end 15 of a ceramic printed circuit board 21, and housing its associated signal processing electronics in the remainder of the printed circuit board. Multiple circuit boards are then stacked in a parallel, layered arrangement, as shown in FIG. 2, so that the ends of adjacent circuit boards, in which the photodiode strips are mounted, form a focal plane array 25. Since, theoretically, the adjacent, parallel-disposed printed circuit boards may be of any length L, the number of signal processing devices they are to accommodate is not limited, as in the case of a conventional back-to-back configuration. In this parallel printed circuit board approach, each ceramic printed circuit board, the thickness T of which is typically on the order of 20 mils, contains multiple pockets 27 into which the signal processing chips 29 are inserted, the chips being interconnected by conventional wiring layers 31 that extend over the surface of the board among the signal processing chips and the photo elements of the die strip at the end of the board. Because of the substantial thickness of each board (e.g. 20 mils) and the resultant spacing between photodiode die strips of adjacent boards, not only is the focal plane array resolution-limited, but there is a 'dead space' (occupied by the material of the printed circuit board) between adjacent end slot-captured photodiode strips, requiring a complicated scanning and interpolation algorithm in the course of driving and processing the outputs of the photodiodes. Moreover, the overall size of a 128×128 array requires a unit approximately four inches on an edge, so that its overall size is not insubstantial.

SUMMARY OF THE INVENTION

In accordance with the present invention, the resolution and size limitations of both the conventional back-to-back and laminated printed circuit board approaches, described above, are obviated by a new and improved focal plane array configuration and an associated technique for manufacturing such an array, in which a first, substantially planar or flat semiconductor substrate, that contains a densely compacted array or matrix of photodiodes, is interconnected with a plurality of extremely thin (on the order of two mils thickness, each) second semiconductor substrates, in which the signal processing electronics for the array are formed. For this purpose, the backside of the focal plane array-containing substrate has an associated array of conductive bumps to which the respective photodiodes on the imaging side are electrically connected. A plurality of second semiconductor substrates, each of which is associated with a respective row of the array of photodiodes and has integrated therein the signal processing electronics for that row, have formed along the side edge portions thereof a plurality of electroplated metallic bumps, or raised land portions, which are conductively connected through semiconductive material of the second semiconductor substrates to the signal processing electronics. The side edge portion of a respective second semiconductor substrate is located in adjacent alignment with plural bumps of the focal plane substrate and is conductively joined to the array bumps by the corresponding metallic bumps that have been electroplated along the side edge portion of that second semiconductor substrate to internal conductive regions that terminate at that side edge portion. Each conductive region is preferably comprised of heavily doped semiconductor material which extends to the side edge portion of the substrate and is connected to regions of the signal processing devices within the semiconductor substrate.

Because of the thinness (two mils thick) of each second (signal processing) substrate, it is not possible to employ conventional photolithographic processing to form the interconnect bumps along the side edges of the substrate. Pursuant to the present invention, this problem is solved by an electroplating technique in which a plurality of isolated doped semiconductor regions are initially formed in prescribed portions (pockets) of the substrate that will contain the device regions that make up the signal processing electronics. Interconnect surface electrodes are then joined to the doped regions and material is removed from the substrate (e.g. by machining or dry etching), to form a groove in the substrate and thereby defining a side edge portion of the semiconductor substrate, through which side portions of the doped regions are defined and exposed. These exposed side portions of the doped regions are then electroplated to form a plurality of metallic land portions, or conductive bumps, to which the signal processing electronics have been connected by the interconnect surface electrodes. At the completion of the electroplating step, the thickness of the second substrate is reduced by removing material from its rear surface (opposite the surface in which the groove was formed). The side edge portions of the second substrate are then brought into adjacent alignment with and conductively joined to the bumps of the focal plane array-containing substrate, each signal processing substrate being oriented orthogonally to the backside of the focal plane array.

Because the present invention makes it possible to house all of the signal processing electronics for a row of photodiodes of the focal plane array in a single, thin substrate (having a thickness on the order of two mils), the individual light responsive elements of the focal plane array can be of reduced size, thereby providing a considerably enhanced resolution optical signal processor. For example, for a 128×128 array, a two mil thickness of the signal processing (second) substrate results in an array size (at two mils per pixel) which is less by an order of magnitude than that of the printed circuit board approach, described previously.

DETAILED DESCRIPTION

Figure 3:
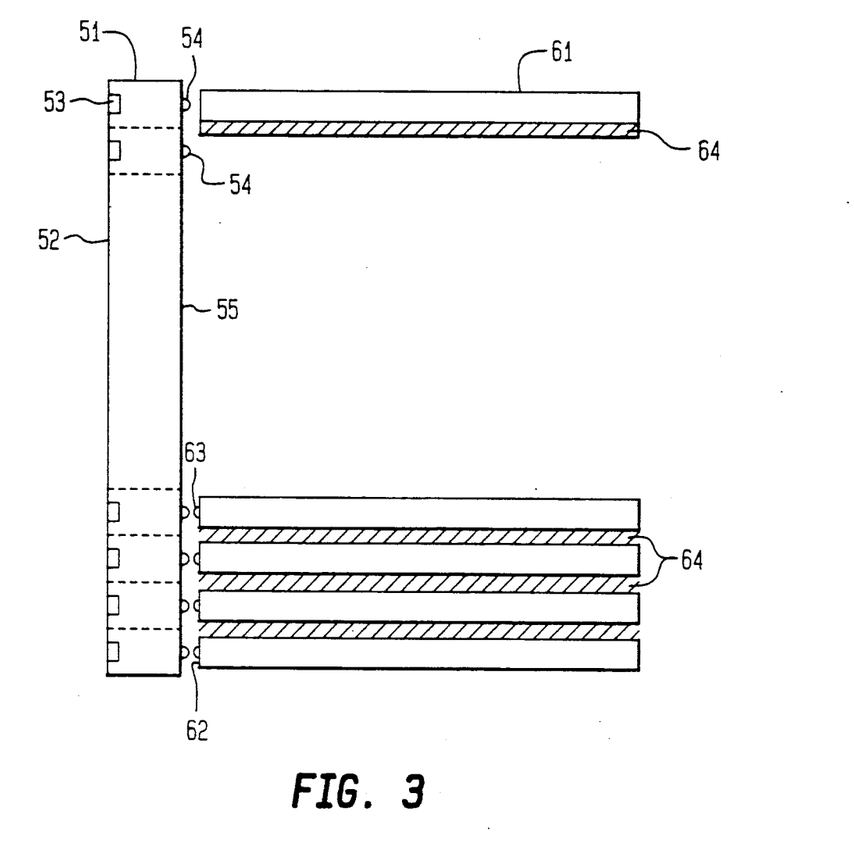
FIG. 3 is a diagrammatic side view of an embodiment of an opto-electronic imaging system in accordance with the present invention.

Referring now to FIG. 3, a diagrammatic side view of an embodiment of an opto-electronic imaging system in accordance with the present invention is shown as containing a f i r s t semiconductor (e.g. silicon) substrate 51 having formed in a first, effectively planar, image-receiving surface 52 thereof an array or matrix of rows and columns (one row of which is shown in FIG. 3) of photoresponsive devices (e.g. photodiodes) 53. Each photodiode is conductively coupled to an associated conductive land portion or 'bump' 54, that extends from a second surface 55 of the substrate, so that second surface 55 contains a matrix of such bumps that are electrically coupled with respective ones of photoresponsive devices 53. Because imaging surface 52 is dedicated to supporting only the photoresponsive devices, the resolution of the focal plane array is theoretically limited only by the packing density and size of the individual photodiodes themselves, there being no other signal processing or inter-chip connectivity components distributed over surface 52.

Disposed adjacent and orthogonal to rear surface 55 of substrate 51 is a parallel arrangement of a plurality of second, signal processing semiconductor substrates 61, each of which is associated and in alignment with a respective row of the bumps 54 to which the matrix of photodiodes 53 is connected. As will be described in detail below, each substrate 61 contains semiconductor regions that are interconnected to form signal processing devices (e.g. amplifiers, integrators, filters, multiplexers, etc.) for processing the outputs of an associated row of photodiodes, and has electroplated along a side or edge portion 62 a plurality of metallic bumps 63, which are conductively connected through regions of doped semiconductive material to the signal processing devices of the substrate. A row of conductive bumps 63 that extends along the side or edge portion 62 of a respective signal processing substrate 61 is conductively joined to a row of corresponding conductive bumps 54 along the rear surface 55 of photodiode chip 51 by conventional bonding techniques, such as pressure bonding, solder reflow, etc.

The thickness of an individual signal processing substrate 61, being on the order of only two mils, permits a very compact integration of high resolution photoelements within the photodiode chip 51 (as the edge thickness of the signal processing substrate 61 effectively defines the physical bounds of a photodiode). Thus, for a row of 128 photodiodes, a size of two mils per element means that a laminate of 128 signal processing substrates 61 (adjacent ones of which are separated by a thin buffer layer 64 of insulator material (e.g. epoxy resin)) will occupy a perimeter less than 300 mils, or less than an order of magnitude smaller than the same dimension of a conventional circuit board array.

The sequence of steps through which a respective signal processing substrate is processed to obtain an side connection or bump that permits the substrate to beg edge-connected to an adjacent substrate in the manner diagrammatically illustrated in FIG. 3 will now be described with reference to FIGS. 4-12. In the course of this description it is to be understood that the processing of the remainder of the substrate to form the device regions and interconnections of those device regions of the signal processing components are conventional and not, per se, part of the present invention. Consequently, details of their specific structure and the processing steps through which such components may be formed will not be described here. Suffice it to say that a respective signal processing substrate is assumed to contain a plurality of such interconnected devices and has an input interconnect terminal (either by way of surface interconnect or buried layer interconnect) to which an electrode layer for coupling an external connection terminal may be joined.

Figure 4:
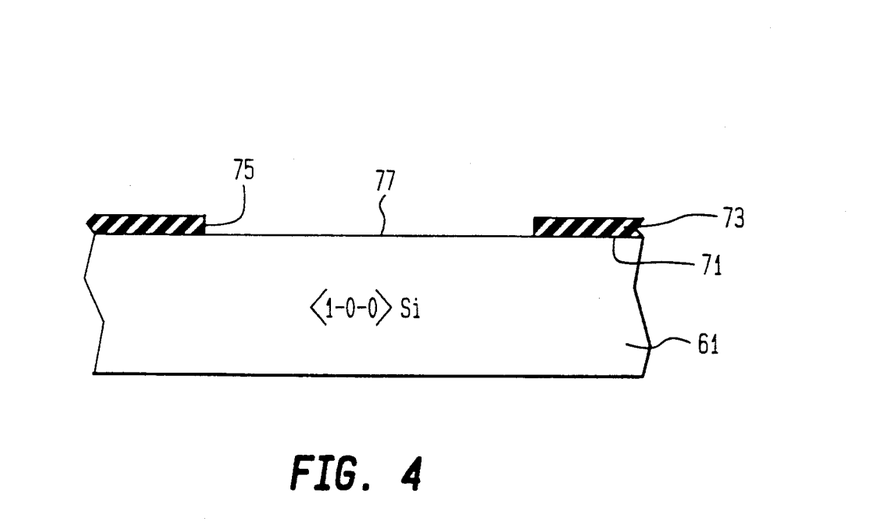
FIGS. 4-12 diagrammatically show a cross-section of a semiconductor substrate during the course of the side edge connection manufacturing process of the present invention.

With reference now to FIG. 4, there is shown a semiconductor substrate 61 (e.g. a several mils thick wafer of silicon) on a planar (e.g.[001]crystalline plane) surface 71 of which a dielectric layer 73 of silicon oxide or other conventional insulator material is selectively formed (e.g. photoresist-patterned) to leave an aperture or window 75, exposing a surface region 77. For the application to the process to the particular structure of a row of multielement components, there will be a plurality of spaced-apart apertures 75, each of which may have a generally rectangular shape, extending in a line into the plane of the Figure; thus, FIG. 4 and subsequent illustrations show the processing for only a single element. It should be noted that the length L of aperture 75 is sufficient to permit the later introduction of a mechanical etching element, such as a diamond saw blade, for subsequent removal of material from (a groove in) the underlying substrate, while still leaving a substantial length of surface area available for formation of a conductive region.

Figure 5:
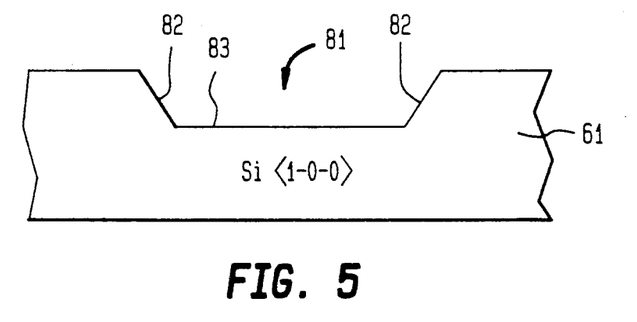
Figure 6:
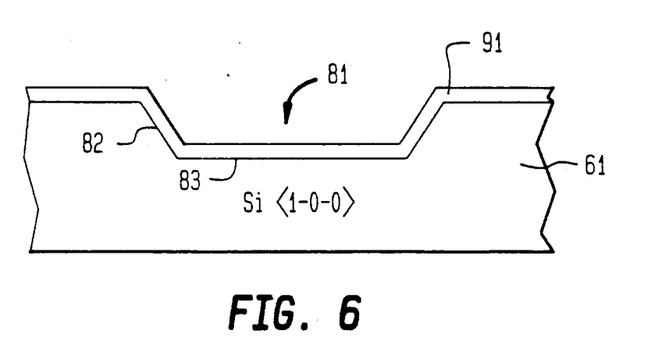

Using aperture 75 in dielectric layer 73 as an etch window, exposed surface region 77 is anisotropically etched using a conventional wet chmeical etch, to thereby form a depression or recess 81 which extends into substrate 61 from top surface 77 and is bounded by sidewalls 82 (to a depth on the order of one mil) terminating at a bottom surface or floor 83, as shown in FIG. 5. After formation of depression 81, oxide layer 73 is stripped and then the entire exposed surface of the substrate, including depression 81, is reoxidized to form a (silicon dioxide) dielectric layer 91 that is contiguous with the top surface 71 of substrate 61, as well as sidewalls 82 and floor 83 of depression 81, as shown in FIG. 6.

As an alternative to anisotropic etching in a wet chemical etch, a dry etching method may be employed. This etch will result in a depression or recess with straight (i.e. normal to the surface) sides, which can then be processesd as defined for the wet etch process.

Following substrate reoxidation, a layer 95 of heavily doped (N+) polysilicon is deposited over oxide layer 91, sufficient to fill depression 81. The polysilicon layer 95 (and underlying oxide layer 91) is then removed (e.g. by etching or grinding) back to the original surface 71 of the substrate, as shown in FIG. 7, to leave a dielectric-isolated pocket or island 95 of heavily doped (N+) polysilicon, the exposed top surface 97 of which is effectively coplanar with top surface 77 of substrate.

Figure 7:
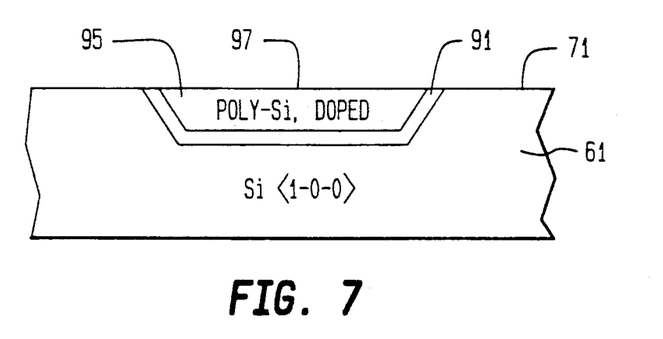

Using the structure shown in FIG. 7, the wafer is then processed to form and interconnect symmetrically arrayed sets (to the left and right of pocket 95 as viewed in the Figures) of device regions (diagrammatically shown at 101) of a pair of signal processors, including the formation of a surface passivation layer 103 and interconnect electrode layers 105. In the course of this fabrication process, impurities are introduced into the top surface 97 of pocket 95, so as to form a heavily doped (N+) surface region 111, at spaced apart surface portions 112, 114 of which a pair of electrodes 113 and 115 are respectively contacted, through apertures in an overlying dielectric (oxide) layer 117. As will be described below, electrodes 113 and 115 are used during the bump electroplating of severed side portions of heavily doped region 111 process and, in addition, provide surface interconnect from the heavily doped regions 111 to the signal processing regions in the remainder of the substrate.

Figure 8:
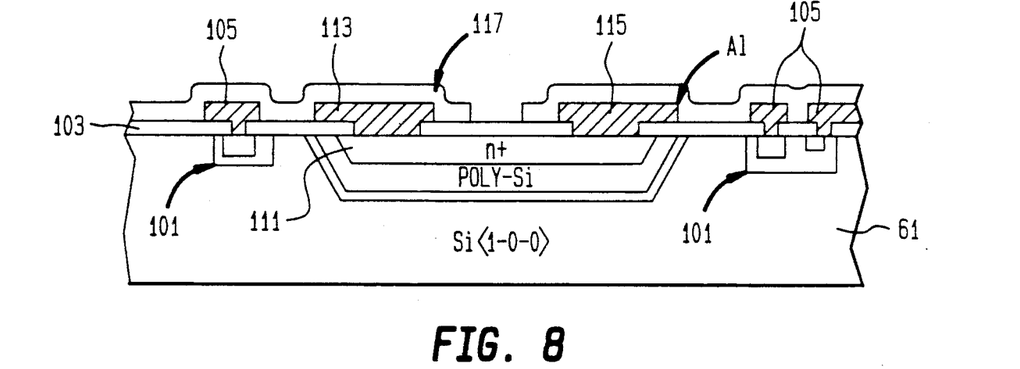
Figure 9:
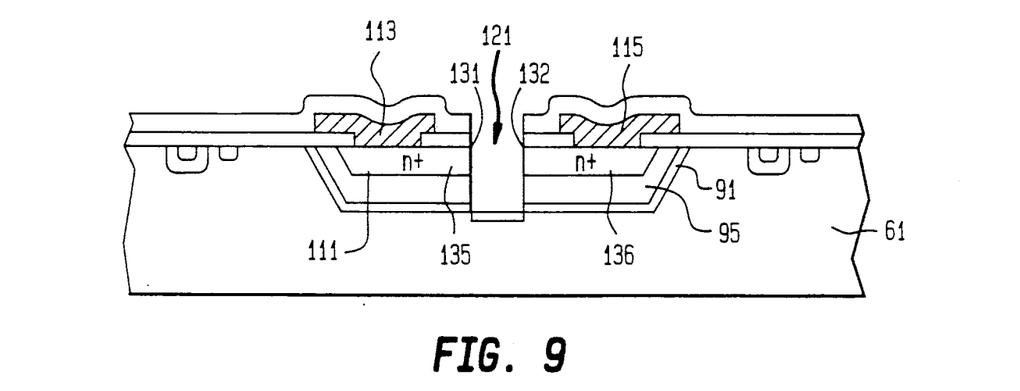
Figure 10:
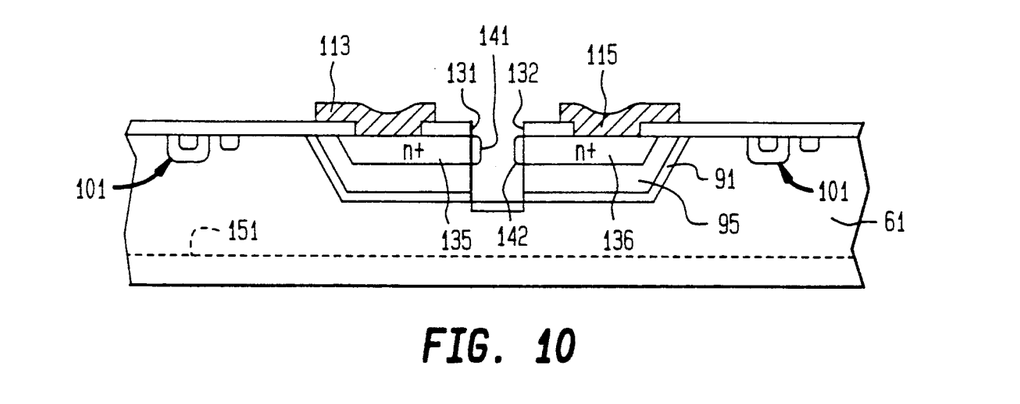
Figure 11:
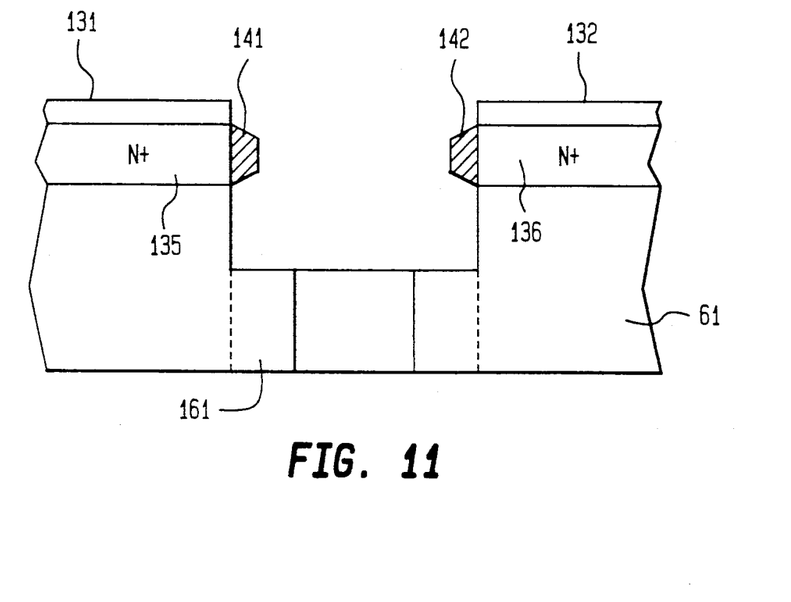

Following device region processing and connection of electrodes 113 and 115 to the heavily doped region 111, producing the configuration shown in FIG. 8, a groove or trench 121 is cut or scribed (e.g. by means of a diamond sawblade) into the top surface of the substrate to a depth of one mil, so as to cut through the bottom floor of pocket 95 and expose a pair of side portions 131 and 132 of heavily doped region 111, which has now been cut or severed into respective heavily doped regions 135 and 136, that are contacted by electrodes 113 and 115, as shown in FIG. 9. Next, the exposed surfaces of the substrate are immersed in an electroplating solution, such as gold cyanide, and each of electrodes 113 and 115 is connected to the negative potential electrode of an electroplate power supply, the positive potential electroplate electrode of which is immersed in the electroplate solution, so as to cause raised land portions or bumps 141 and 142 to be plated onto the exposed side portions 131 and 132 of regions 135 and 136, respectively.

The height or thickness of each bump will depend upon conventional electroplate parameters, such as type and strength of solution, electroplate voltage, time of application, etc. and will not be detailed here, as they are not necessary for understanding and carrying out the present invention. Indeed, electroplate processing steps conventionally employed for planar surface electrode formation may be used. What is essential is that there be exposed side regions within an edge portion of the substrate which are capable of providing a growth site for the spaced apart rows of bumps 141 and 142 that are to be used for achieving the intended edge connection of each signal processing substrate 61 to a corresponding row of bumps 54 on the backside of the photodiode chip.

Figure 12:
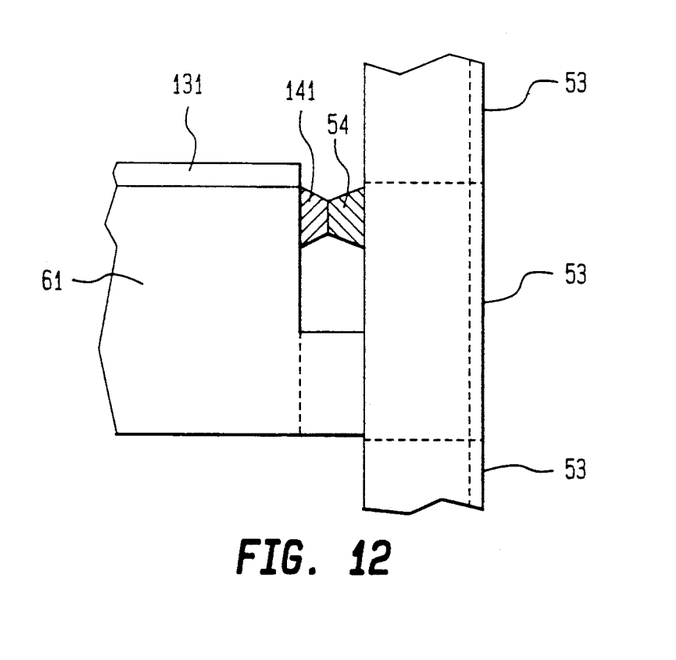

After completion of the electroplating process, the wafer is backlapped (e.g. by mechanical grinding and/or chemical etch) until the material removal plane (shown by broken lines 151 in FIG. 10) intersects groove 121 and thereby severs the 'thinned' substrate into separate dice, each of which has a row of edge-connection bumps 141/142 corresponding to bumps 63, shown in FIG. 3. Rather than thinning the substrate all the way to the bottom of groove 121, the substrate may be partially lapped and then scribed (via a laser kerf) to the bottom of the groove as shown by removal region 155 in FIG. 11, so as to leave a predetermined portion of the substrate as a projection or lip 161 beneath bump 63. Through precision machining (e.g. laser cutting) of this portion of the substrate, the actual distance by which projection 161 extends beyond the bump 63 may be tailored to complement the extension of a bump 54 on the backside of the photodiode chip 51 and thereby facilitate location and joining of the two substrates, as shown in FIG. 12. Pickup and placement of an individual die may be effected by means of a conventional robotic manipulation system, including the use of a vacuum tipped end-effector for seizing the severed die and transporting it into position in alignment with and bump-to-bump contact with a row of contacts of the backside of the photodiode chip 51, as shown in FIG. 3, described above.

As will be appreciated from the foregoing description, the edge connection methodology according to the present invention provides a technique for substantially reducing the resolution and size limitations of conventional back-to-back and laminated printed circuit board approaches to multiple substrate interconnect mechanisms, such as focal plane array bump structures, described above. By electroplating exposed side portions of heavily doped semiconductor regions that afford connectivity to multiple device regions of an associated signal processing structure, it is not only possible to avoid unnecessary use of precious semiconductor real estate commodity (e.g. a dedicated high resolution photodiode array), but to permit its resolution to be optimized in a substantially reduced volume packaging arrangement. Because of the ability to house all of the signal processing electronics for a row of photodiodes of the focal plane array in a single, thin substrate having thickness on the order of only two mils), it becomes possible to employ a very high resolution photodiode array, thereby providing a considerably enhanced resolution optical signal processor.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed is:

1. A method of forming a metallic link to a side portion of a semiconductor substrate comprising the steps of:
   (a) forming, in said substrate, a region of doped semiconductor material capable of being electroplated with a metallic layer;
   (b) attaching an electrode layer to a first portion of said region;
   (c) removing material from said substrate, so as to define a said portion of said substrate at which a side portion of said regions spaced apart from said first portion thereof, is exposed; and
   (d) electroplating a metallic layer onto said side portion of said region, using said electrode layer as an electroplating electrode, while placing said side portion of said region in contact with an electroplating solution.

2. A method according to claim 1, wherein step (a) comprises forming, in a first surface portion of said semiconductor substrate, a dielectric ally isolated pocket of semiconductor material containing said region of doped semiconductor material, and wherein step (b) comprises attaching said electrode layer to a top surface portion of said region.

3. A method according to claim 2, further including the step of:
   (e) removing additional material from said substrate so as to define a side edge portion of said substrate which includes the side portion of said region to which a metallic layer has been electroplated in step (d).

4. A method of conductively connecting an array of photoresponsive devices that are supported within a first semiconductor substrate and for which respective conductive land portions are provided over a first surface of said first semiconductor substrate, to signal processing devices that are supported in a second semiconductor substrate comprising the steps of:
   (a) forming, in said second semiconductor substrate, a plurality of regions of material capable of being plated with respective metallic layers and providing conductive connections between said regions and signal processing devices that are supported within said second semiconductor substrate;
   (b) removing material from said second semiconductor substrate, so as to form a side edge portion of said second semiconductor substrate exposing respective side portions of said regions;
   (c) plating respective metallic layers to the respective side portions of said regions and thereby providing a plurality of metallic land portions at a side edge portion of said second semiconductor substrate that are conductively connected to said plurality of signal processing devices supported therein; and
   (d) bringing said side edge portion of said second semiconductor substrate into adjacent alignment with plural conductive land portions of said first semiconductor substrate and conductively joining said plural conductive land portions of said first semiconductor substrate with plural metallic layers that have been plated to side portions of said regions in step (c).

5. A method according to claim 4, wherein step (c) further includes removing additional material from said second semiconductor substrate, so as to define a side edge of said second semiconductor substrate which includes the side portions of said regions to which metallic layers have been plated in step (c).

6. A method according to claim 4, wherein step (a) comprises the steps of:
   (a1) forming, in a first surface portion of said second semiconductor substrate, a plurality of pockets, each of which contains a respective region of doped semiconductor material, and
   (a2) attaching plural conductive layers to top surface portions of respective ones of said regions.

7. A method according to claim 6, wherein step (b) comprises removing material from said pockets so as to expose side portions of said regions, spaced apart from said conductive layers, and wherein step (c) comprises electroplating metallic layers onto exposed side portions of said regions, using said conductive layers as electroplating electrodes, while placing the exposed side portions of said regions in contact with an electroplating solution.

8. A method according to claim 4, wherein said array comprises a two-dimensional array of photoresponsive devices and step (d) comprises bringing the side edge portions of a plurality of adjacent second semiconductor substrates, that have been formed in accordance with step (c), into alignment with respective sets of plural conductive land portions of said first semiconductor substrate and conductively joining the plural conductive land portions of respective ones of said sets with plural metallic layers that have been plated to side portions of regions o respective ones of said second semiconductor substrates.

9. A method of manufacturing an opto-electronic imaging system comprising the steps of:
   (a) providing a first semiconductor substrate having formed in a first surface thereof a matrix of rows and columns of photoresponsive devices and having extending from a second surface thereof an associated matrix of conductive land portions that are electrically coupled with respective ones of said photoresponsive devices;
   (b) providing, for each row of said matrix of photoresponsive devices, a respective second semiconductor substrate into which are integrated semiconductor regions interconnected to form signal processing devices for processing the outputs of an associated row of said matrix of photoresponsive devices;
   (c) forming, along a side edge portion of each respective second semiconductor substrate, a plurality of metallic bumps which are conductively connected to signal processing devices within said second semiconductor substrate; and
   (d) bringing the side edge portion of a respective second semiconductor substrate into adjacent alignment with plural conductive land portions of said first semiconductor substrate and conductively joining said plural conductive land portions of said first semiconductor substrate with plural metallic bumps along side portions of said respective second semiconductor substrate.

10. A method according to claim 9, wherein step (c) comprises
    (c1) forming, in each respective second semiconductor substrate, a plurality of regions of material capable of being plated with respective metallic layers and providing conductive connections between said regions and signal processing devices within said second semiconductor substrate;
    (c2) removing material from each second semiconductor substrate, so as to form a side edge portion of each second semiconductor substrate exposing respective side portions of said regions; and (c3) plating respective metallic bumps to the respective side portions of said regions and thereby providing a plurality of metallic bumps at a side edge portion of each second semiconductor substrate that are conductively connected to signal processing devices therein.

11. A method of forming an edge connector to a substrate comprising the steps of:

(a) forming, in said substrate, a doped semiconductor region capable of being bonded with conductive material;

(b) removing material of said doped semiconductor region and exposing a side portion o said doped semiconductor region; and (c) bonding conductive material to said exposed side portion of said ad doped semiconductor region, and wherein step (a) comprises the steps of:

(a1) forming, in a first surface portion of a semiconductor substrate, a pocket containing a region of doped semiconductor material, and (a2) attaching a conductive layer to a top surface portion of said region, and wherein step (b) comprises removing material from said pocket, so as to expose a side portion of said region, spaced apart from said conductive layer, and wherein step (c) comprises electroplating a metallic layer onto said exposed side portion of said region, using said conductive layer as an electroplating electrode, while placing said exposed side portion of said region in contact with an electroplating solution.

12. A method according to claim 11, wherein step (a2) includes the steps o selectively forming a dielectric layer over the surface of said substrate so a s to expose a top surface portion of said region, and forming said conductive layer on said dielectric layer so s to extend through an aperture therein and contact said region.

13. A method of forming an edge connector to a substrate comprising the steps of:

(a) forming, in said substrate, a region of material capable o being bonded with conductive material and extending laterally within said substrate so as to intersect the eventual edge of said substrate;

(b) removing material of said substrate so as to expose a side portion of said region at said eventual edge of said substrate; and (c) bonding conductive material to said exposed side portion of said region, and wherein step (a) comprises the steps of:

(a1) forming, in a first surface portion of a semiconductor substrate, a pocket containing a region of doped semiconductor material extending laterally within said substrate so as to intersect the eventual edge of said substrate, and (a2) attaching a conductive layer to a top surface portion of said region, and wherein step (b) comprises removing material from said pocket, so as to expose a side portion of said region, spaced apart from said conductive layer, and wherein step (c) comprises electroplating a metallic layer onto said exposed side portion of said region, using said conductive layer as an electroplating electrode, while placing said exposed side portion of said region in contact with an electroplating solution.

14. A method according to claim 13, wherein step (a2) includes the steps of selectively forming a dielectric layer over the surface of said substrate so as to expose a top surface potion of said region, and forming said conductive layer on said dielectric layer so as to extend through an overture therein and contact said region.

* * * * *